(12) United States Patent
Endo et al.

(10) Patent No.: US 6,716,730 B2
(45) Date of Patent: Apr. 6, 2004

(54) PATTERN FORMATION METHOD

(75) Inventors: Masayuki Endo, Osaka (JP); Masaru Sasago, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/339,602

(22) Filed: Jan. 10, 2003

(65) Prior Publication Data
US 2003/0143824 A1 Jul. 31, 2003

(30) Foreign Application Priority Data
Jan. 16, 2002 (JP) ........................................ 2002-006959

(51) Int. Cl.$^7$ ............................ H01L 21/22; H01L 21/38
(52) U.S. Cl. ........................................ 438/552; 438/758
(58) Field of Search ......................... 438/30, 552, 572, 438/590, 635, 758

(56) References Cited

U.S. PATENT DOCUMENTS 4,403,151 A * 9/1983 Mochiji et al.
6,511,786 B2 * 1/2003 Kishimura et al.

FOREIGN PATENT DOCUMENTS

JP 07-153662 6/1995

\* cited by examiner

*Primary Examiner*—Phuc T. Dang
(74) *Attorney, Agent, or Firm*—McDermott, Will & Emery

(57) ABSTRACT

After pre-baking a resist film, a solvent included in the resist film is vaporized. After vaporizing the solvent included in the resist film, pattern exposure is performed by selectively irradiating the resist film with exposing light in vacuum. The resist film is developed after the pattern exposure, so as to form a resist pattern.

9 Claims, 4 Drawing Sheets

PATTERN FORMATION METHOD

BACKGROUND OF THE INVENTION

The present invention relates to a pattern formation method employed in semiconductor fabrication process.

In accordance with the increased degree of integration of semiconductor integrated circuits and the downsizing of semiconductor devices, development of lithography technique is desired to be accelerated.

At present, patterns are formed through photolithography using a mercury lamp, KrF excimer laser or ArF excimer laser as exposing light. In order to form a fine pattern of 0.1 $\mu$m or less and particularly 50 nm or less, application of exposure in vacuum with extreme UV (i.e., light of a wavelength of a 1 nm through 30 nm band) or electron beams to the exposing light is now under examination. Also, as a resist material suitable to such exposing light, a chemically amplified resist material with high resolution and sensitivity is used.

Now, a conventional pattern formation method in which pattern exposure is performed by irradiating a resist film made of a chemically amplified resist material with extreme UV in vacuum will be described with reference to FIGS. 4A through 4D.

First, a chemically amplified resist material having the following composition is prepared:

| | |
|---|---|
| Base polymer: poly((2-methyl-2-adamantyl acrylate) - (methyl methacrylate) - (methacrylic acid)) (wherein 2-methyl-2-adamantyl acrylate:methyl methacrylate:methacrylic acid = 70 mol %:20 mol %:10 mol %) | 2 g |
| Acid generator:triphenylsulfonium triflate | 0.4 g |
| Solvent:propylene glycol monomethyl ether acetate | 20 g |

Next, as shown in FIG. 4A, the chemically amplified resist material is applied on a semiconductor substrate 1 by spin coating, so as to form a resist film 2 with a thickness of 0.2 $\mu$m. Thereafter, the resist film 2 is subjected to baking 3 for pre-bake at a temperature of 90° C. for 60 seconds with a hot plate.

Then, as shown in FIG. 4B, pattern exposure is performed by irradiating the pre-baked resist film 2 with extreme UV 4 of a wavelength of 13.5 nm in vacuum through a reflection mask not shown.

Thereafter, as shown in FIG. 4C, the resist film 2 is subjected to baking 5 at a temperature of 110° C. for 60 seconds with a hot plate. Thus, an exposed portion 2a of the resist film 2 becomes soluble in an alkaline developer owing to a function of an acid generated from the acid generator while an unexposed portion 2b of the resist film 2 remains insoluble in an alkaline developer because no acid is generated therein.

Subsequently, as shown in FIG. 4D, the resist film 2 is developed with a 2.38 wt % tetramethylammonium hydroxide developer (alkaline developer), so as to form a resist pattern 6 with a line width of 0.07 $\mu$m.

As shown in FIG. 4D, however, the resultant resist pattern 6 is degraded in its cross-sectional shape.

The degradation in the shape of the resist pattern 6 seems to be caused for the following reason:

In the pattern exposure performed by irradiating the pre-baked resist film 2 with extreme UV 4 in vacuum, an outgas is generated from the resist film 2 and the generated outgas adheres onto a mirror or a mask of an exposure optical system. Therefore, the illuminance of the exposing light used for irradiating the resist film 2 is lowered, and hence, a sufficient amount of acid cannot be generated from the acid generator in the exposed portion 2a of the resist film 2.

SUMMARY OF THE INVENTION

In consideration of the aforementioned conventional problem, an object of the invention is forming a resist pattern in a good cross-sectional shape by reducing the amount of outgas generated from a resist film during pattern exposure.

In order to achieve the object, the pattern formation method of this invention includes the steps of performing pre-bake on a resist film; vaporizing a solvent included in the resist film after the pre-bake; performing pattern exposure by selectively irradiating the resist film with exposing light in vacuum after vaporizing the solvent; and forming a resist pattern by developing the resist film after the pattern exposure.

In the pattern formation method of this invention, after vaporizing the solvent included in the pre-baked resist film, the resist film is subjected to the pattern exposure in vacuum. Therefore, the amount of outgas generated from the resist film during the pattern exposure is largely reduced, and the amount of acid generator and the like leaked to the outside with the solvent in vacuum is reduced. Accordingly, the amount of outgas adhered onto a mirror or a mask of an exposure optical system can be remarkably reduced, and the illuminance of the exposing light irradiating the resist film can be increased. As the result, a resist pattern can be formed in a good cross-sectional shape.

In the pattern formation method of this invention, in the step of vaporizing a solvent, an amount of solvent included in the resist film after vaporizing the solvent is preferably reduced to 10% or less of an amount of solvent included in the resist film before the pre-bake.

Thus, the amount of outgas generated from the resist film during the pattern exposure can be definitely reduced.

In the pattern formation method of this invention, the step of vaporizing a solvent preferably includes a sub-step of baking the resist film after the pre-bake.

Thus, the solvent included in the resist film can be easily and definitely vaporized.

In the pattern formation method of this invention, the step of vaporizing a solvent preferably includes a sub-step of irradiating the resist film with an energy beam after the pre-bake.

Thus, the solvent included in the resist film can be easily and definitely vaporized.

In this case, the energy beam is preferably UV or deep UV.

Thus, the solvent included in the resist film can be vaporized without inducing the resist film with the energy beam.

In the pattern formation method of this invention, the resist film is preferably made of a chemically amplified resist material.

In this case, a base polymer of the chemically amplified resist material may be a phenol polymer, an acrylic polymer, a methacrylic polymer or a cycloolefin polymer.

In the pattern formation method of this invention, the exposing light can be extreme UV of a wavelength of a 1 nm through 30 nm band or an electron beam.

Alternatively, in the pattern formation method of this invention, the exposing light can be extreme UV of a wavelength of a 13.5 nm band.

DETAILED DESCRIPTION OF THE INVENTION

EMBODIMENT 1

A pattern formation method according to Embodiment 1 of the invention will now be described with reference to FIGS. 1A through 1E and 3.

First, a chemically amplified resist material having the following composition is prepared:

| | |
|---|---|
| Base polymer: poly((2-methyl-2-adamantyl acrylate) - (methyl methacrylate) - (methacrylic acid)) (wherein 2-methyl-2-adamantyl acrylate:methyl methacrylate:methacrylic acid = 70 mol %:20 mol %:10 mol %) | 2 g |
| Acid generator: triphenylsulfonium triflate | 0.4 g |
| Solvent: propylene glycol monomethyl ether acetate | 20 g |

Figure 1A:
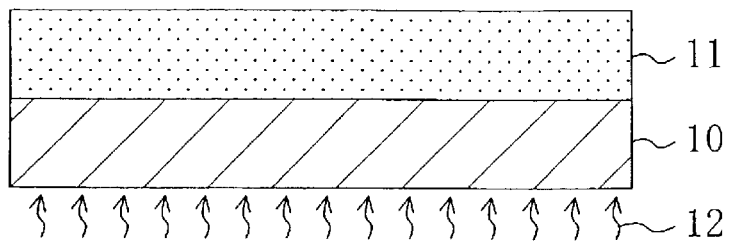
FIGS. 1A, 1B, 1C, 1D and 1E are cross-sectional views for showing procedures in a pattern formation method according to Embodiment 1 of the invention.

Next, as shown in FIG. 1A, the chemically amplified resist material is applied on a semiconductor substrate 10 by spin coating, so as to form a resist film 11 with a thickness of 0.2 $\mu$m. Thereafter, the resist film 11 is subjected to first baking 12 for pre-bake at a temperature of 90° C. for 60 seconds with a hot plate.

Figure 1B:
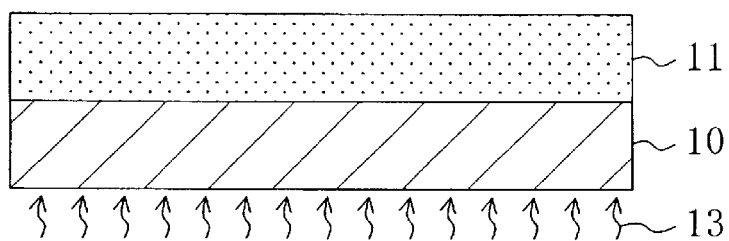

Then, as shown in FIG. 1B, the pre-baked resist film 11 is subjected to second baking 13 at a temperature of 110° C. for 60 seconds with a hot plate, so as to vaporize the solvent included in the resist film 11. In this manner, the amount of solvent included in the resist film 11 after vaporizing the solvent becomes 10% or less of the amount of solvent included in the resist film 11 before the pre-bake.

The pre-bake procedure and the procedure for vaporizing the solvent are separately performed for the following reason:

In order to sufficiently vaporize the solvent included in the resist film 11 through the pre-bake procedure alone, it is necessary to increase the baking time and the baking temperature. When the baking time and the baking temperature are increased, a photosensitive component (such as the acid generator) included in the resist film 11 can be damaged or the resist film 11 can shrink because the base polymer included in the resist film 11 shrinks. As a result, the resolution characteristic of the resist film 11 is degraded.

In contrast, when the procedure for vaporizing the solvent included in the resist film 11 is performed on the pre-baked resist film 11, the resolution characteristic of the resist film 11 is not degraded. This is because when the thermal history of the resist film 11 is once suspended, the solvent included in the resist film 11 can be vaporized while suppressing the degree of the increase of the baking time and the baking temperature.

Figure 1C:
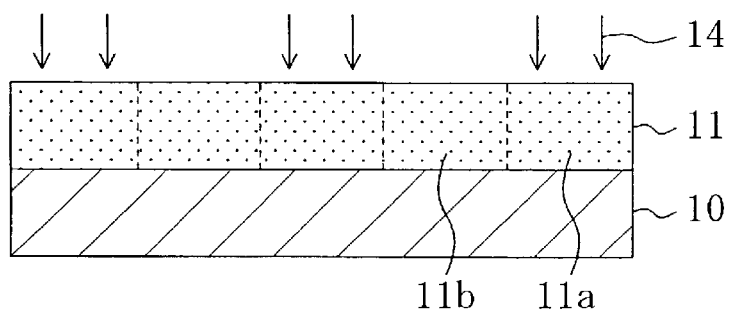

Next, as shown in FIG. 1C, pattern exposure is performed by irradiating the resist film 11, from which the solvent has been vaporized through the baking, with extreme UV 14 of a wavelength of a 13.5 nm band in vacuum selectively through a reflection mask not shown. Thus, the amount of solvent vaporized from the resist film 11 during this exposure is largely reduced, so that the amount of outgas adhered onto a mirror or a mask of an exposure optical system can be remarkably reduced.

Figure 1D:
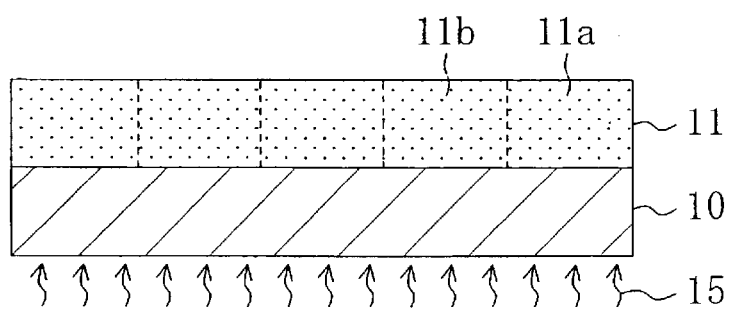

Thereafter, as shown in FIG. 1D, the resist film 11 is subjected to third baking 15 at a temperature of 110° C. for 60 seconds with a hot plate. Thus, an exposed portion 11a of the resist film 11 becomes soluble in an alkaline developer owing to a function of an acid generated from the acid generator while an unexposed portion 11b of the resist film 11 remains insoluble in an alkaline developer because no acid is generated therein.

Figure 1E:
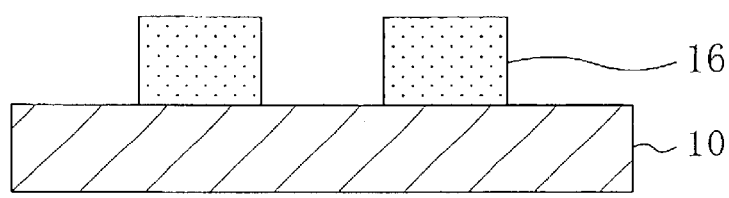

Subsequently, as shown in FIG. 1E, the resist film 11 is developed with a 2.38 wt % tetramethylammonium hydroxide developer (alkaline developer) after the pattern exposure, so as to form a resist pattern 16 with a line width of 0.7 $\mu$m.

According to Embodiment 1, since the resist film 11 is subjected to the pattern exposure in vacuum after vaporizing the solvent included in the resist film 11, the amount of outgas generated from the resist film 11 during the pattern exposure is largely reduced. Therefore, the amount of outgas adhered onto the mirror or the mask can be remarkably reduced. As a result, the resist pattern 16 can be formed in a good cross-sectional shape.

Although the pre-baked resist film 11 is subjected to the baking 13 at a temperature of 110° C. for 60 seconds with a hot plate in Embodiment 1, the resist film 11 may be subjected to baking at a temperature of 70 through 150° C. for 30 through 300 seconds with a hot plate instead.

Figure 3:
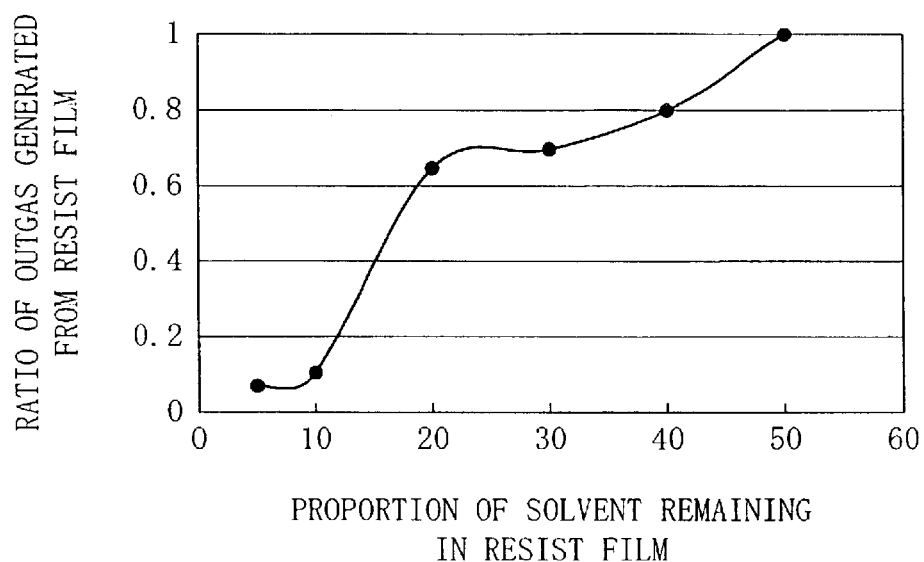
FIG. 3 is a characteristic diagram for showing the relationship between the proportion of a solvent remaining in a resist film and the ratio of an outgas generated from the resist film.
Figure 4A:
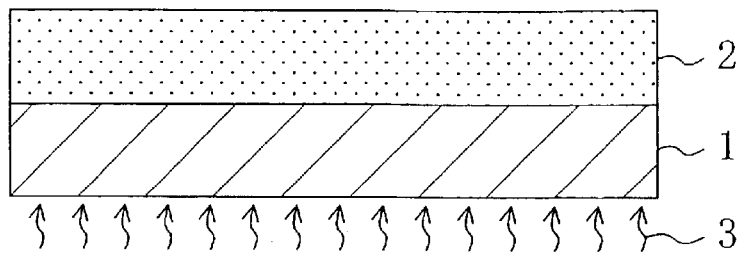
FIGS. 4A, 4B, 4C and 4D are cross-sectional views for showing procedures in a conventional pattern formation method.
Figure 4B:
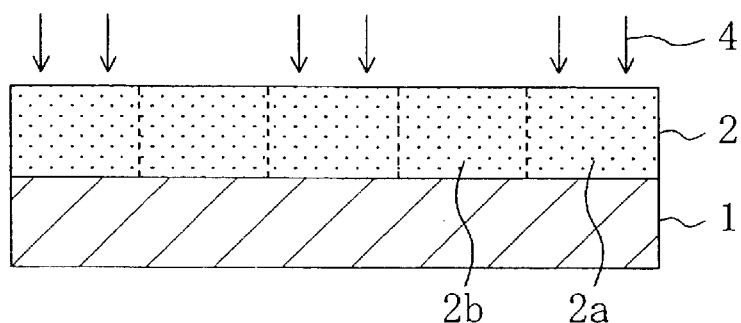
Figure 4C:
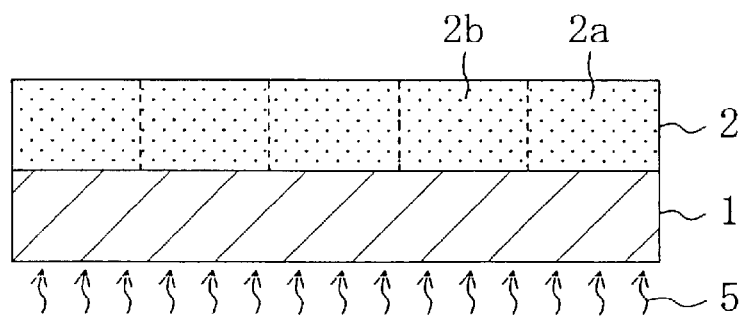
Figure 4D:
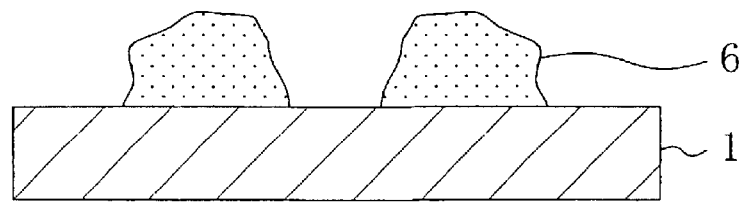

FIG. 3 shows the relationship between the proportion of the solvent remaining in the resist film (namely, the proportion of the amount of solvent included in the resist film 11 after the procedure for vaporizing the solvent to the amount of solvent included in the resist film 11 before the pre-bake) and the ratio of the outgas generated from the resist film (namely, the ratio of the amount of outgas generated from the resist film 11 when the solvent is vaporized to the amount of outgas generated from the resist film 11 when the solvent is not vaporized).

As is understood from FIG. 3, when the proportion of the solvent remaining in the resist film is 10% or less, the ratio of the outgas generated from the resist film is largely lowered.

EMBODIMENT 2

A pattern formation method according to Embodiment 2 of the invention will now be described with reference to FIGS. 2A through 2E.

First, a chemically amplified resist material having the following composition is prepared:

| | |
|---|---|
| Base polymer: poly((2-methyl-2-adamantyl acrylate) - (methyl methacrylate) - (methacrylic acid)) (wherein 2-methyl-2-adamantyl acrylate:methyl methacrylate:methacrylic acid = 70 mol %:20 mol %:10 mol %) | 2 g |
| Acid generator: triphenylsulfonium triflate | 0.4 g |
| Solvent: propylene glycol monomethyl ether acetate | 20 g |

Figure 2A:
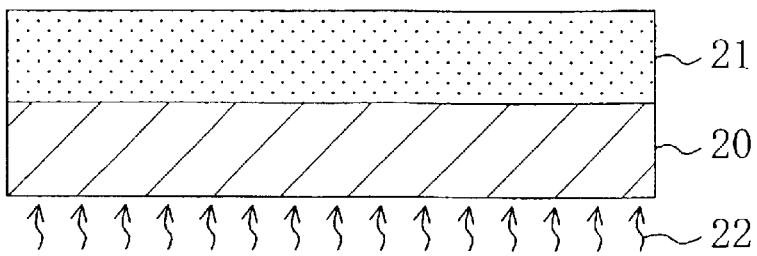
FIGS. 2A, 2B, 2C, 2D and 2E are cross-sectional views for showing procedures in a pattern formation method according to Embodiment 2 of the invention.

Next, as shown in FIG. 2a, the chemically amplified resist material is applied on a semiconductor substrate 20 by spin coating, so as to form a resist film 21 with a thickness of 0.2 μm. Thereafter, the resist film 21 is subjected to first baking 22 for pre-bake at a temperature of 90° C. for 60 seconds with a hot plate.

Figure 2B:
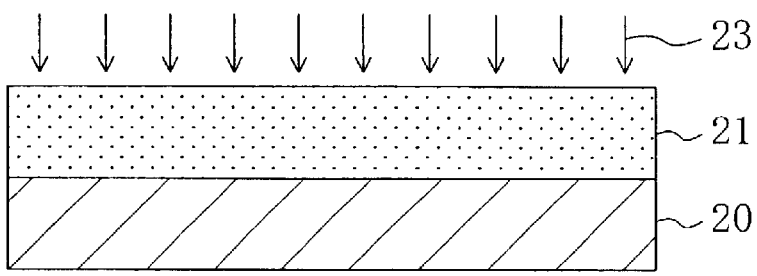

Then, as shown in FIG. 2b, the pre-baked resist film 21 is irradiated with UV 23, serving as an energy beam, emitted from a mercury lamp at energy of 20 mJ/cm$^2$, so as to vaporize the solvent included in the resist film 21. In this manner, the amount of solvent included in the resist film 21 after vaporizing the solvent becomes 10% or less of the amount of solvent included in the resist film 21 before the pre-bake.

Figure 2C:
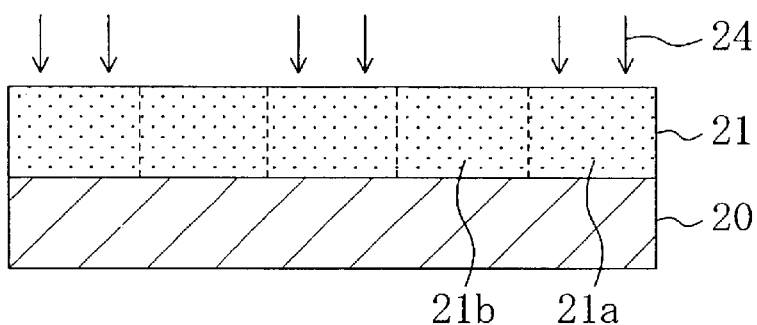

Next, as shown in FIG. 2C, pattern exposure is performed by irradiating the resist film 21, from which the solvent has been vaporized through the irradiation with the energy beam, with extreme UV 24 of a wavelength of a 13.5 nm band in vacuum selectively through a reflection mask not shown. Thus, the amount of solvent vaporized from the resist film 21 during this exposure is largely reduced, so that the amount of outgas adhered onto a mirror or a mask of an exposure optical system can be remarkably reduced.

Figure 2D:
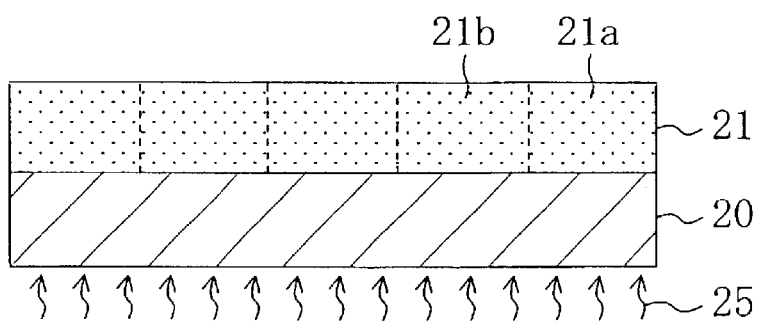

Thereafter, as shown in FIG. 2D, the resist film 21 is subjected to second baking 25 at a temperature of 110° C. for 60 seconds with a hot plate. Thus, an exposed portion 21a of the resist film 21 becomes soluble in an alkaline developer owing to a function of an acid generated from the acid generator while an unexposed portion 21b of the resist film 21 remains insoluble in an alkaline developer because no acid is generated therein.

Figure 2E:
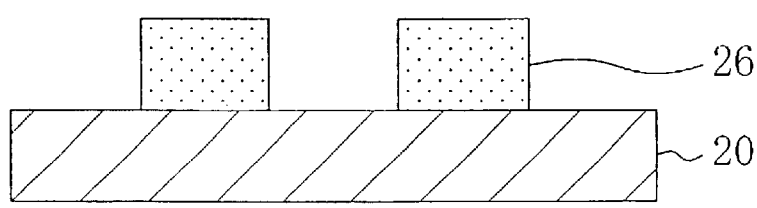

Subsequently, as shown in FIG. 2E, the resist film 21 is developed with a 2.38 wt % tetramethylammonium hydroxide developer (alkaline developer) after the pattern exposure, so as to form a resist pattern 26 with a line width of 0.7 μm.

According to Embodiment 2, since the resist film 21 is subjected to the pattern exposure in vacuum after vaporizing the solvent included in the resist film 21, the amount of outgas generated from the resist film 21 during the pattern exposure is largely reduced. Therefore, the amount of outgas adhered onto the mirror or the mask can be remarkably reduced. As a result, the resist pattern 26 can be formed in a good cross-sectional shape.

Although UV is irradiated as the energy beam in Embodiment 2, deep UV may be irradiated instead. Alternatively, any energy beam of a wavelength for vaporizing the solvent included in the resist film 21 without inducing the resist film 21 may be appropriately used.

The energy of the energy beam is not limited to 20 mJ/cm$^2$ but may be, for example, 10 mJ/cm$^2$ through 2 J/cm$^2$.

Although extreme UV of a wavelength of a 13.5 nm band is irradiated as the exposing light in Embodiments 1 and 2, any extreme UV of a wavelength of a 1 nm through 30 nm band or an electron beam may be irradiated instead.

Although the chemically amplified resist material is used in Embodiments 1 and 2, a non-chemically amplified resist material may be used instead.

The base polymer of the chemically amplified resist material may be any of phenol polymers, acrylic polymers, methacrylic polymers and cycloolefin polymers, which do not limit the invention.

Examples of the base polymer of the chemically amplified resist material are as follows:

(1) Phenol polymers:
poly((ethoxyethyloxystyrene)-(hydroxystyrene))(wherein ethoxyethyloxystyrene:hydroxystyrene=35 mol %:65 mol %)
poly((methoxymethyloxystyrene)-(hydroxystyrene)) (wherein methoxymethyloxystyrene:hydroxystyrene= 40 mol %:60 mol %)
poly((tetrahydropyranyloxystyrene)-(hydroxystyrene)) (wherein tetrahydropyranyloxystyrene:hydroxystyrene=35 mol %:65 mol %)
poly((phenoxyethyloxystyrene)-(hydroxystyrene)) (wherein phenoxyethyloxystyrene:hydroxystyrene=32 mol %:68 mol %)
poly((t-butyloxystyrene)-(hydroxystyrene))(wherein t-butyloxystyrene hydroxystyrene=30 mol %:70 mol %)
poly((t-butyloxycarbonyloxystyrene)-(hydroxystyrene)) (wherein t-butyloxycarbonyloxystyrene:hydroxystyrene=30 mol %:70 mol %)
poly((t-butyloxycarbonylmethyloxystyrene)-(hydroxystyrene))(wherein t-butyloxycarbonylmethyloxystyrene:hydroxystyrene= 28 mol %:72 mol %)

(2) Acrylic polymers:
poly((2-methyl-2-adamantyl acrylate)-(mevalonic lactone acrylate))(wherein 2-methyl-2-adamantyl acrylate:mevalonic lactone acrylate=50 mol %:50 mol %)
poly((2-etyhyl-2-adamantyl acrylate)-(γ-butyrolactone acrylate))(wherein 2-ethyl-2-adamantyl acrylate:γ-butyrolactone acrylate=50 mol %:50 mol %)

(3) Methacrylic polymers:
poly((2-methyl-2-adamantyl methacrylate)-(mevalonic lactone methacrylate)) (wherein 2-methyl-2-adamantyl methacrylate:mevalonic lactone methacrylate=50 mol %:50 mol %)
poly((2-ethyl-2-adamantyl methacrylate)-(γ-butyrolactone methacrylate)) (wherein 2-ethyl-2-adamantyl methacrylate:γ-butyrolactone methacrylate= 50 mol % 50 mol %)
poly((2-methyl-2-adamantyl acrylate)-(mevalonic lactone methacrylate)) (wherein 2-methyl-2-adamantyl acrylate:mevalonic lactone methacrylate=50 mol %:50 mol %)
poly((2-ethyl-2-adamantyl acrylate)-(γ-butyrolactone methacrylate))(wherein 2-ethyl-2-adamantyl acrylate:γ-butyrolactone methacrylate=50 mol %:50 mol %)

(4) Cycloolefin polymers:
poly((5-t-butylnorbornene-5-carboxylate)-(norbornene-5-carboxylate)) (wherein 5-t-butylnorbornene-5-carboxylate:norbornene-5-carboxylate=40 mol %:60 mol %)
poly((5-t-butylnorbornene-5-methylenehexafluoroisopropylalcohol)-(norbornene-5-methylenehexafluoroisopropylalcohol)) (wherein 5-t-butylnorbornene-5- methylenehexafluoroisopropylalcohol:norbornene-5-methylenehexafluoroisopropylalcohol=35 mol %:65 mol %)

poly((5-t-butylnorbornene-5-carboxylate)-(maleic anhydride))(wherein 5-t-butylnorbornene-5-carboxylate:maleic anhydride=50 mol %:50 mol %)

poly((5-t-butylnorbornene-5-carboxylate)-(norbornene-5-carboxylate)-(maleic anhydride))(wherein 5-t-butylnorbornene-5-carboxylate:norbornene-5-carboxylate:maleic anhydride=40 mol %:10 mol %:50 mol %)

poly((5-t-butylnorbornene-5-methylenehexafluoroisopropylalcohol)-(maleic anhydride))(wherein 5-t-butylnorbornene-5-methylhexafluoroisopropylalcohol:maleic anhydride= 50 mol %:50 mol %)

poly((5-t-butylnorbornene-5-methylenehexafluoroisopropylalcohol)-(norbornene-5-methylenehexafluoroisopropylalcohol)-(maleic anhydride))(wherein 5-t-butylnorbornene-5-methylenehexafluoroisopropylalcohol:norbornene-5-methylenehexafluoroisopropylalcohol:maleic anhydride=35 mol %:15 mol %:50 mol %)

poly((5-t-butylnorbornene-5-carboxylate)-(maleic anhydride)-(2-methyl-2-adamantyl methacrylate)-(γ-butyrolactone methacrylate))(wherein 5-t-butylnorbornene-5-carboxylate:maleic anhydride:2-methyl-2-admantyl methacrylate:γ-butyrolactone methacrylate=25 mol %:25 mol %:30 mol %:20 mol %)

poly((5-t-butylnorbornene-5-carboxylate)-(maleic anhydride)-(γ-butyrolactone methacrylate))(wherein 5-t-butylnorbornene-5-carboxylate:maleic anhydride:γ-butyrolactone methacrylate=40 mol %:40 mol %:20 mol %)

poly((5-t-butylnorbornene-5-carboxylate)-maleic anhydride)-(2-ethyl-2-adamantyl acrylate)-(mevalonic lactone acrylate))(wherein 5-t-butylnorbornene-5-carboxylate:maleic anhydride:2-ethyl-2-adamantyl acrylate:mevalonic lactone acrylate =25 mol %:25 mol %:35 mol %:15 mol %)

poly((5-t-butylnorbornene-5-carboxylate)-(maleic anhydride)-(mevalonic lactone acrylate))(wherein 5-t-butylnorbornene-5-carboxylate:maleic anhydride:mevalonic lactone acrylate=40 mol %:40 mol %:20 mol %)

What is claimed is:

1. A pattern formation method comprising the steps of:

performing pre-bake on a resist film;

vaporizing a solvent included in said resist film after the pre-bake;

performing pattern exposure by selectively irradiating said resist film with exposing light in vacuum after vaporizing said solvent; and forming a resist pattern by developing said resist film after the pattern exposure.

2. The pattern formation method of claim 1, wherein, in the step of vaporizing a solvent, an amount of said solvent included in said resist film after vaporizing said solvent is reduced to 10% or less of an amount of said solvent included in said resist film before the pre-bake.

3. The pattern formation method of claim 1, wherein the step of vaporizing a solvent includes a sub-step of baking said resist film after the pre-bake.

4. The pattern formation method of claim 1, wherein the step of vaporizing a solvent includes a sub-step of irradiating said resist film with an energy beam after the pre-bake.

5. The pattern formation method of claim 4, wherein said energy beam is UV or deep UV.

6. The pattern formation method of claim 1, wherein said resist film is made of a chemically amplified resist material.

7. The pattern formation method of claim 6, wherein a base polymer of said chemically amplified resist material is a phenol polymer, an acrylic polymer, a methacrylic polymer or a cycloolefin polymer.

8. The pattern formation method of claim 1, wherein said exposing light is extreme UV of a wavelength of a 1 nm through 30 nm band or an electron beam.

9. The pattern formation method of claim 1, wherein said exposing light is extreme UV of a wavelength of a 13.5 nm band.

* * * * *